United States Patent [19]

Yatsurugi et al.

[11] Patent Number: 4,565,913

[45] Date of Patent: Jan. 21, 1986

[54] METHOD FOR THE DISINTEGRATION OF SILICON FOR SEMICONDUCTOR

[75] Inventors: Yoshifumi Yatsurugi, Fujisawa; Meiseki Katayama, Ebetsu, both of Japan

[73] Assignee: Komatsu Electronic Metals Co., Ltd., Tokyo, Japan

[21] Appl. No.: 630,118

[22] Filed: Jul. 12, 1984

[30] Foreign Application Priority Data

Aug. 2, 1983 [JP] Japan ............................... 58-140589

[51] Int. Cl.[4] ............................................. H05B 6/80
[52] U.S. Cl. ........................ 219/10.55 M; 219/10.55 R; 219/10.55 B; 148/1.5; 156/DIG. 65; 299/14; 241/23
[58] Field of Search ............... 219/10.55 M, 10.55 B, 219/10.55 R, 10.55 A, 10.57; 299/14; 148/1.5; 241/23; 156/602, 617 R, DIG. 65

[56] References Cited

U.S. PATENT DOCUMENTS

| | | | |
|---|---|---|---|
| 3,275,787 | 9/1966 | Newberry | 241/23 X |
| 3,430,021 | 2/1969 | Watson | 219/10.55 M |
| 3,443,051 | 5/1969 | Püschner | 219/10.57 X |
| 3,923,653 | 12/1975 | Lavins, Jr. | 219/10.57 X |
| 4,138,306 | 2/1979 | Niwa | 219/10.55 R X |
| 4,196,332 | 4/1980 | Mackay et al. | 219/10.55 B |
| 4,314,128 | 2/1982 | Chitre | 219/10.55 F X |
| 4,474,625 | 10/1984 | Cohen et al. | 219/10.55 A X |

Primary Examiner—Philip H. Leung
Attorney, Agent, or Firm—Larson and Taylor

[57] ABSTRACT

A method for the disintegration of silicon for preparation of semiconductor materials. Polycrystalline silicon in a rod form is subjected to microwave radiation in an oven for a short period of time, whereby the rod-like polycrystalline silicon is dielectrically heated quickly from its inside thereby causing it to be disintegrated.

6 Claims, 1 Drawing Figure

U.S. Patent  Jan. 21, 1986  4,565,913
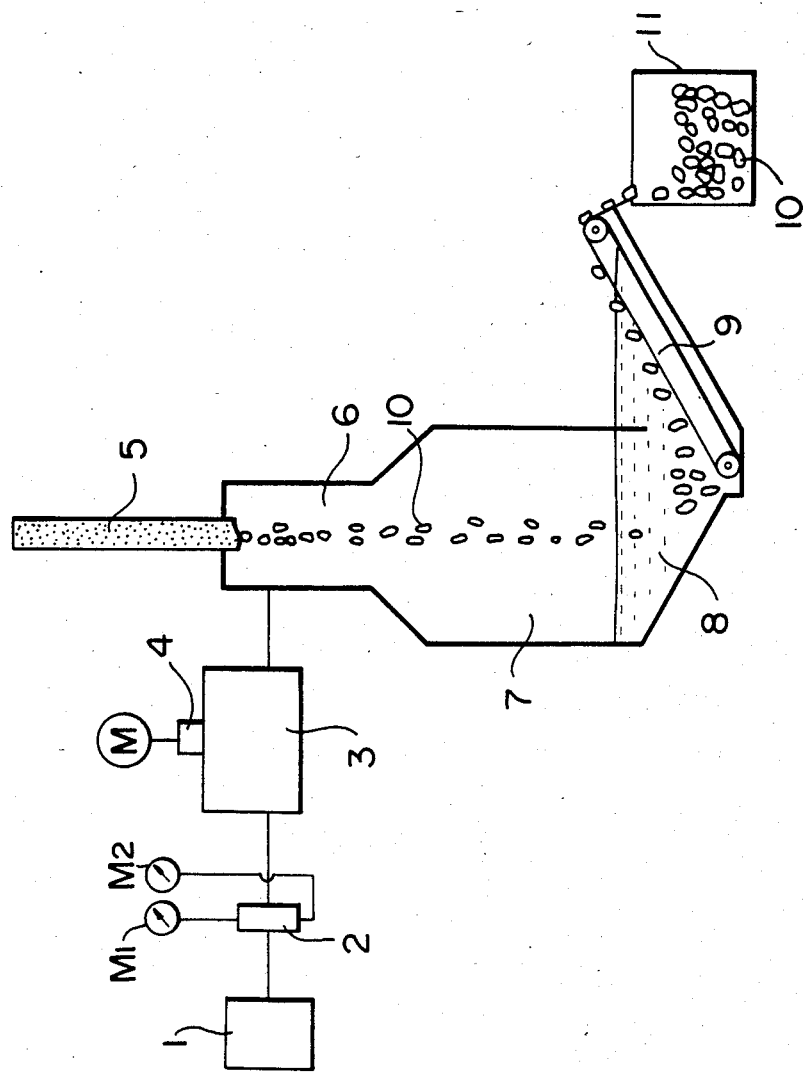

METHOD FOR THE DISINTEGRATION OF SILICON FOR SEMICONDUCTOR

This invention relates to a method for the disintegration of silicon for the preparation of semiconductor materials.

Silicon for the preparation of semiconductor materials is obtained as a highly pure, rod-like polycrystalline material by precipitating a refined silicon compound on a silicon core wire directly heated by electric current.

Most of the silicon in rod form thus obtained is disintegrated to a suitable size for use in making monocrystalline material according to the Czochralski method.

According to the currently used methods for the disintegrtion of silicon, silicon in rod form is cut into small pieces by a tool such as diamond blade, broken by hammer, crushed by crushing means such as a jaw crusher, or disintegrated by a method in which the silicon is first heated at high temperature by externally heating in a furnace and then dropped into water to allow it to be broken by quick cooling.

In these known methods, silicon cannot be prevented from contamination caused by contact with materials other than silicon or from contamination caused by generation of high temperature, so that the crushed silicon must be washed by chemicals such as a mixture of nitric acid and hydrofluoric acid to remove the contaminated surface.

It is an object of the present invention to provide a disintegrating method in which contamination of the silicon is minimized.

The present invention comprises a method in which polycrystalline silicon in a rod form (hereinafter referred to as rod-like polycrystal) is subjected to microwave radiation in an oven for a short period of time whereby the rod-like polycrystal is dielectrically heated quickly from its inside, thereby causing it to be disintegrated.

The rod-like polycrystal is inserted as is from its one end into a microwave oven. The end of the polycrystal inserted into the oven is heated in about ten seconds and disintegrated at the same time. Then another portion of the rod-like polycrystal is fed into the oven, and it will be similarly disintegrated in about ten seconds. The silicon thus disintegrated is immediately discharged out of the oven. The operation is continued until the rod-like polycrystal is disintegrated into necessary sizes. The particle size of the disintegrated silicon is determined by the quantity of the rod-like polycrystal fed into the oven and the magnitude of the microwave radiation in the oven.

The invention will be described more in detail, by way of example, with reference to the accompanying drawing which is a diagrammatic side elevation view of apparatus suitable for carrying out the method of the invention.

Microwave radiation is generated by a generator 1 and guided to a directional coupler 2 by a waveguide. The microwave radiation, in which the progressive wave and the reflected wave have been measured by the directional coupler 2 having a meter ($M_1$) for measuring the progressive wave and a meter ($M_2$) for measuring the reflected wave, passes through a matching box 3 and is guided into a microwave oven 6. A rod-like polycrystal 5 is inserted into the oven 6 from the upper portion of the oven. The silicon 10 which is disintegrated by being dielectrically heated by the microwave radiation descends into a receptacle 7 whose bottom is filled with pure water 8. The silicon thus disintegrated is stored in a tank 11, the stored silicon is dried and then packed to be ready for use as a material for making monocrystalline silicon according to the Czochralski method.

The matching box 3 is used to take advantage of microwave for disintegrating the rod-like polycrystal 5 most efficiently. A controller 4 of the matching box 3 is regulated so that in an operational state the reflected wave of the directional coupler 2 is minimized.

As will be understood from the foregoing, the dielectric heating by microwave radiation is a heating generated without contact by an implement. Unlike ordinary heating in a furnace, including infrared heating, microwave radiation effects clean heating without contamination from the apparatus. It is thus possible to disintegrate the rod-like polycrystal very quickly.

EXAMPLE 1

A microwave oven having 10 KW output and a frequency of about 2.45 GHz was used. Five rods of polycrystal of 10 cm diameter and 20 cm length were laid on a pan made of quartz, fed into the oven, discharged after two minutes, and finally charged into a tank filled with pure water. Three of the five rods were disintegrated in the oven while two others were disintegrated in the pure water. Large masses in the disintegrated silicon could be easily broken by a plastic hammer.

EXAMPLE 2

The frequency of microwave radiation in Example 1 was changed to approximately 915 MHz, but other conditions were the same as in Example 1. The result was almost the same as in Example 1.

EXAMPLE 3

The same apparatus and the same rod-like polycrystal as in Example 1 were employed. At the same time as the generation of microwave radiation, the controller in the matching box was activated in such a manner that the reflected wave shown by directional coupler was minimized. Generation of the microwave radiation was continued for two minutes before stopping. The heated silicon was then charged into pure water. The five rods were all disintegrated during the heating step.

EXAMPLE 4

The same microwave device as in Example 3 was employed, but the oven was remodeled so that longer rods of polycrystal might be inserted from the upper portion of the oven and the masses of the disintegrated polycrystal silicon might fall into pure water.

An end portion of 10–20 cm length of a rod-like polycrystal was inserted into the oven, and microwave radiation was generated. Simultaneously with the disintegrating a further rod-like polycrystal of 10–20 cm length was similarly inserted, and the disintegrated silicon was dropped into pure water. All the rods of polycrystal (about 2 m length) were disintegrated.

EXAMPLE 5

Example 4 was repeated except that the generation of microwave radiation was stopped after one minute. When the polycrystal was not disintegrated during the generation of the microwave radiation, pure water was immediately jetted onto the periphery of the heated rod-like polycrystal thereby promoting disintegration.

What is claimed is:

1. A method of disintegrating polycrystalline silicon in rod form into a size suitable for making monocrystalline material according to the Czochralski method comprising:

introducing polycrystalline silicon in rod form into a microwave oven;

subjecting the polycrystalline silicon in rod form to microwave radiation in said oven for a short time to quickly dielectrically heat the polycrystalline silicon in rod form and to disintegrate it into a size suitable for making monocrystalline material according to the Czochralski method.

2. A method according to claim 1 wherein said polycrystalline silicon in rod form is introduced lengthwise into said oven.

3. A method according to claim 1 further comprising generating the microwave radiation, guiding the generated radiation to a directional coupler, measuring the progressive and reflected waves of the microwave radiation, and guiding the microwave radiation through a matching box and into said oven.

4. A method according to claim 3 further comprising controlling said matching box to minimize the reflected wave.

5. A method according to claim 1 further comprising discharging the disintegrated silicon into pure water.

6. A method according to claim 1 further comprising contacting the heating silicon to promote the disintegration of any silicon not disintegrated by said dielectric heating alone.

* * * * *